United States Patent
Dechen et al.

(10) Patent No.: US 9,362,869 B2
(45) Date of Patent: Jun. 7, 2016

(54) SIGNAL PREDISTORTION FOR NON-LINEAR AMPLIFIER

(75) Inventors: Frank Dechen, Blaustein (DE); Bjoern Jelonnek, Ulm (DE); Michael Weber, Neu-Ulm (DE)

(73) Assignee: Nokia Solutions and Networks Oy, Espoo (FI)

( * ) Notice: Subject to any disclaimer, the term of this patent is extended or adjusted under 35 U.S.C. 154(b) by 0 days.

(21) Appl. No.: 14/232,071

(22) PCT Filed: Jul. 13, 2011

(86) PCT No.: PCT/EP2011/061903
§ 371 (c)(1),
(2), (4) Date: Feb. 4, 2014

(87) PCT Pub. No.: WO2013/007300
PCT Pub. Date: Jan. 17, 2013

(65) Prior Publication Data
US 2014/0292406 A1    Oct. 2, 2014

(51) Int. Cl.
*H03F 1/32* (2006.01)
*H03F 1/26* (2006.01)
*H03F 1/30* (2006.01)
*H03F 3/195* (2006.01)
*H03F 3/24* (2006.01)
*H04L 27/36* (2006.01)

(52) U.S. Cl.
CPC ............... *H03F 1/3247* (2013.01); *H03F 1/30* (2013.01); *H03F 1/3241* (2013.01); *H03F 1/3258* (2013.01); *H03F 1/3282* (2013.01); *H03F 3/195* (2013.01); *H03F 3/24* (2013.01); *H04L 27/368* (2013.01); *H03F 2200/336* (2013.01); *H03F 2200/447* (2013.01); *H03F 2200/451* (2013.01); *H03F 2201/3209* (2013.01); *H03F 2201/3212* (2013.01); *H03F 2201/3224* (2013.01); *H03F 2201/3227* (2013.01); *H03F 2201/3233* (2013.01)

(58) Field of Classification Search
USPC ................. 330/149; 455/114.3; 375/296–297
See application file for complete search history.

(56) References Cited

U.S. PATENT DOCUMENTS

| | | | |
|---|---|---|---|
| 8,390,375 B2 * | 3/2013 | Miyashita | 330/149 |
| 2004/0152433 A1 | 8/2004 | Braithwaite | 455/194.2 |
| 2006/0226903 A1 | 10/2006 | Muller et al. | 330/149 |

FOREIGN PATENT DOCUMENTS

WO    WO 2004/086607 A1    10/2004

* cited by examiner

*Primary Examiner* — Hieu Nguyen
(74) *Attorney, Agent, or Firm* — Harrington & Smith

(57) ABSTRACT

A method, apparatus, and computer program for modeling mathematically an effect of a plurality of factors on signal distortion caused by a non-linear amplifier are provided. First, there is computed a global model which incorporates a combined effect of the plurality of factors on signal distortion caused by the non-linear amplifier. Before applying the pre-distorted transmission signal to the non-linear amplifier, a transmission signal is pre-distorted with coefficients derived from the global model thus compensating for the signal distortion caused by the non-linear amplifier.

24 Claims, 4 Drawing Sheets

SIGNAL PREDISTORTION FOR NON-LINEAR AMPLIFIER

FIELD

The invention relates to the field of signal processing and, particularly, to predistorting a signal in an electronic device.

BACKGROUND

Several electronic devices nowadays comprise non-linear amplifier. An example of a non-linear amplifier is a power amplifier which is a component of a radio transmitter circuitry that amplifies a transmission signal for radio transmission. Characteristics of the non-linear amplifiers depend on several external factors that may be understood as working conditions of the non-linear amplifier. Such working conditions may include a power supply voltage, a bias voltage, and temperature. Varying working conditions cause variance in the operational characteristics of the non-linear amplifier, e.g. in linearity of the amplifier. Therefore, different working conditions may cause the amplifier to distort an amplified signal differently.

BRIEF DESCRIPTION

According to an aspect of the present invention, there is provided a method as specified in claim 1.

According to another aspect of the present invention, there is provided an apparatus as specified in claim 14.

According to another aspect of the present invention, there is provided an apparatus as specified in claim 28.

According to yet another aspect of the present invention, there is provided a computer program product embodied on a computer readable distribution medium as specified in claim 29.

Embodiments of the invention are defined in the dependent claims.

LIST OF DRAWINGS

Embodiments of the present invention are described below, by way of example only, with reference to the accompanying drawings, in which FIG. 1 illustrates a general block diagram of a radio transmitter comprising predistortion elements according to embodiments of the invention;

Figures 7A, 7B:
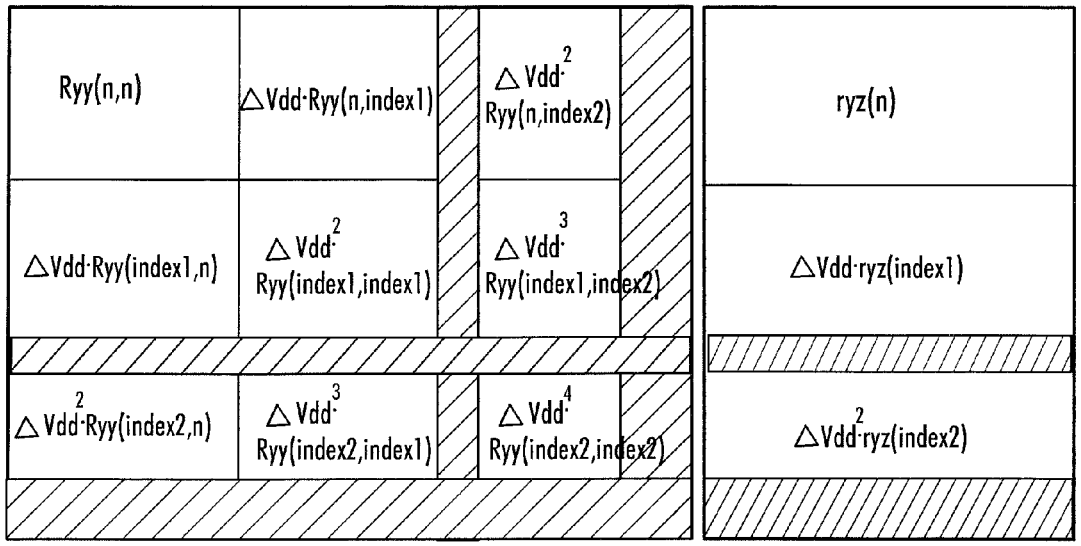
Figures 8A, 8B:
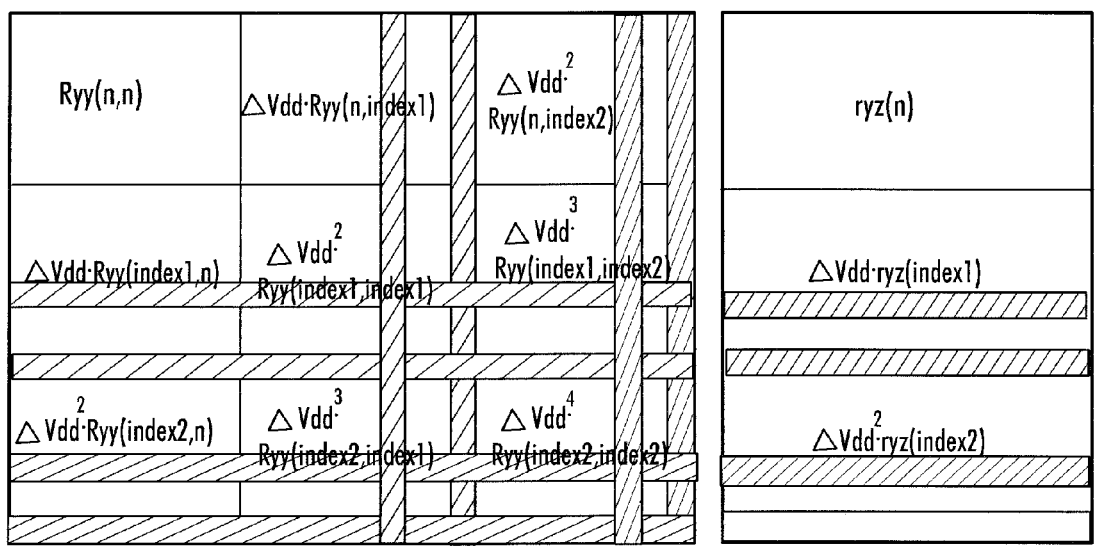
Figure 9:
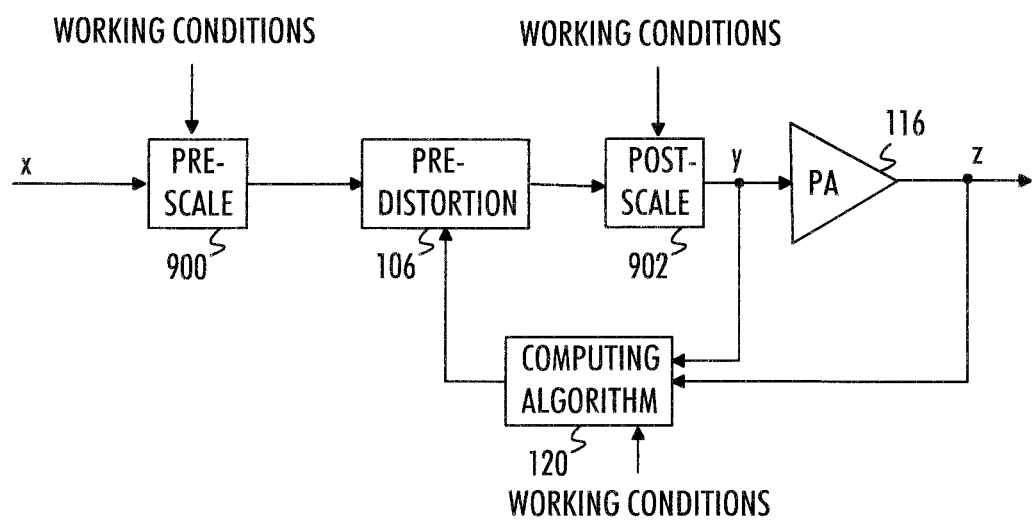

FIGS. 7A, 7B, 8A, and 8B illustrate embodiments for reducing complexity of the predistortion algorithm; and FIG. 9 illustrates an embodiment for scaling the transmission signal according to an embodiment of the invention.

DESCRIPTION OF EMBODIMENTS

The following embodiments are exemplary. Although the specification may refer to "an", "one", or "some" embodiment(s) in several locations, this does not necessarily mean that each such reference is to the same embodiment(s), or that the feature only applies to a single embodiment. Single features of different embodiments may also be combined to provide other embodiments. Furthermore, words "comprising" and "including" should be understood as not limiting the described embodiments to consist of only those features that have been mentioned and such embodiments may contain also features/structures that have not been specifically mentioned. It should also be appreciated that while the following description discloses a power amplifier of a radio transmitter as an example of a non-linear amplifier, embodiments of the invention are applicable to other non-linear amplifiers in other electronic device, e.g. other amplifiers comprised in radio communication devices and amplifiers comprised in consumer electric devices such as audio amplifiers.

Figure 1:
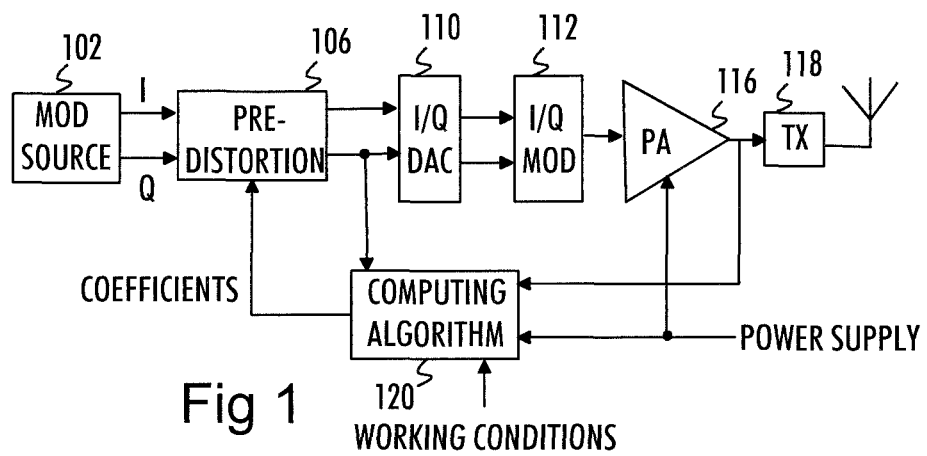

FIG. 1 is a block diagram illustrating components of a radio transmitter according to an embodiment of the invention. The radio transmitter may be a mobile communication device, for example. The block diagram of FIG. 1 illustrates components related to predistortion and power amplification of a transmission signal. All of the components illustrated in FIG. 1 are obviously not necessary for carrying out the invention, and the radio transmitter may comprise additional components.

In FIG. 1, a modulation source 102 provides a transmission signal comprising information symbols to be transmitted from the radio transmitter to a radio receiver. The transmission signal may be in a digital form and divided into an in-phase (I) component and a quadrature (Q) component. The transmission signal is then fed to a predistortion unit 106. The predistortion unit 106 receives the I and Q components of the transmission signal output from modulation source 102. Additionally, the predistortion unit 106 receives weighting coefficients from a computation algorithm circuitry 120 configured to control the predistortion. The computation algorithm circuitry 120 may have knowledge on the amplitude and phase distortion properties of a power amplifier 116 and it may predistort the transmission signal (I and Q component) by computing the weighting coefficients that compensate for the distortion caused by the power amplifier 116. The operation of the computation algorithm circuitry 120 will be described in detail below. The predistortion unit 106 outputs the predistorted transmission signal into an I/Q D/A converter 110. The I/Q D/A converter 110 converts the digital I and Q components into analog signals and feeds them to an I/Q modulator 112. The I/Q modulator 112 converts the baseband analog I and Q components of the transmission signal into a radio frequency (RF) transmission signal. In other words, the I/Q modulator 112 modulates a carrier signal according to the information contained in the I or Q component of the transmission signal. A separate carrier is modulated for each I and Q component and a phase shift between the two carriers is typically 90 degrees. The carriers are then summed together to provide the RF transmission signal.

The RF transmission signal is then fed to the power amplifier 116. The power amplifier 116 receives a power supply voltage from a power supply voltage generator, which may be a switched-mode power supply (SMPS), for example. The power amplifier 116 then amplifies the transmission signal according to the power supply voltage provided by the power supply voltage generator and applies the power-amplified transmission signal to radio frequency (RF) front-end components 118 for transmission through an antenna, for example.

Elements processing digital baseband signals according to FIG. 1 may be implemented in one or more processing units configured by suitable software, application-specific integrated circuits (ASICs), and/or as separate logic circuits, for example.

Figure 2:
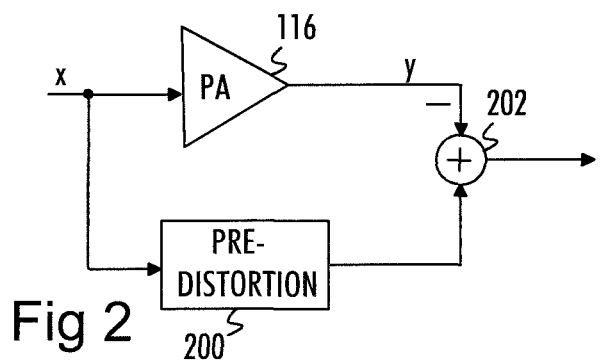
FIG. 2 illustrates predistortion according to an embodiment.

As mentioned above, one aspect in the predistortion of the transmission signal is to negate the signal distortion caused by the power amplifier. Therefore, a distortion model of the power amplifier is estimated. Referring to FIG. 2 illustrating estimation of a distortion model of the power amplifier, x denotes an input signal of the power amplifier 116, e.g. a multi-carrier transmission signal, and y denotes an output signal of the power amplifier 116. In FIG. 2, the input signal x is also fed to the predistortion circuitry 200. A summer 202 computes a difference between the outputs of the power amplifier and the estimated distortion model as computed by the predistortion circuitry 200. When the predistortion circuitry 200 provides an accurate estimation of the power amplifier 116, it's output signal equals the distortion caused by the power amplifier. As a consequence, the difference between the output y and the distortion model output from the predistortion circuitry 200 is zero. For the estimation of the power amplifier model, this gives us a cost function NLM (x)−y which should be minimized. Let us refer to NLM(x) as a non-linear memory function of x. There are several embodiments for realizing the non-linear memory function that is used to process the input signal x (the transmission signal). One example is a simple polynomial function as:

$$NLM = f(x, a) = a_0 + a_1 x + a_2 x^2 + \ldots + a_i x^i, \; i \in N \quad (1)$$

Other well-known solutions for realizing such a non-linear memory function include Taylor series, Volterra series, time-shifted relations of x as realized by filters, e.g. finite or infinite impulse response digital filters), look-up tables, or any combination of such functions. In general, we may write the NLM into the following generalized form:

$$NLM = f(x, a) = \sum_{i=0}^{n} a_i f_i(x), \; i \in N \quad (2)$$

The function $f_i(x)$ may define base functions for the NLM, and they may be selected according to the series representation. One example is shown in Equation (1), and another example may be, for example:

$$f_i(x) = x_i \cdot |x_{i-k}|^2 \quad (3)$$

Coefficients $a_i$ define the predistortion of the transmission signal, and they may be computed such that the predistortion compensates for the distortion caused by the power amplifier 116 in its current operational environment. As a consequence, the coefficients $a_i$ may be acquired as a result of minimizing the above-mentioned cost function. One example of the cost function is the norm of NLM−y as $$\|f(x,a) - y\| \quad (4)$$

or Euclidean norm $$\|f(x,a) - y\|_2 \quad (5)$$

As mentioned above, several factors affect the operation of the power amplifier 116 and, thus, the signal distortion properties of the power amplifier 116. An embodiment of the present invention aims to take into account a plurality of such factors called working conditions of the power amplifier 116. As a consequence, the NLM is expanded as:

$$NLM = \quad (6)$$

$$f(x, a, p) = \sum_{\mu=0}^{m} g_\mu(p_\mu) \cdot f(x, a_\mu) = \sum_{\mu=0}^{m} g_\mu(p_\mu) \cdot \sum_{i=0}^{n} a_{i,\mu} f_i(x),$$

-continued $$\mu \in M, \; i \in N$$

Parameters $p_\mu$ represent different working conditions, e.g. temperature, supply voltage of the power amplifier, gate or a base voltage of the power amplifier, and bandwidth of the transmission signal. Each working condition causes the power amplifier to distort the transmission signal according to a function $g_\mu$, as shown in Equation (6). It should be noted that, while Equation (6) does not show, any one of the working conditions may be time-variant, and the time-variance may be included in the NLM by making the functions $g_\mu$ time-variant. One example of a time-variant working condition is the temperature.

Figure 3:
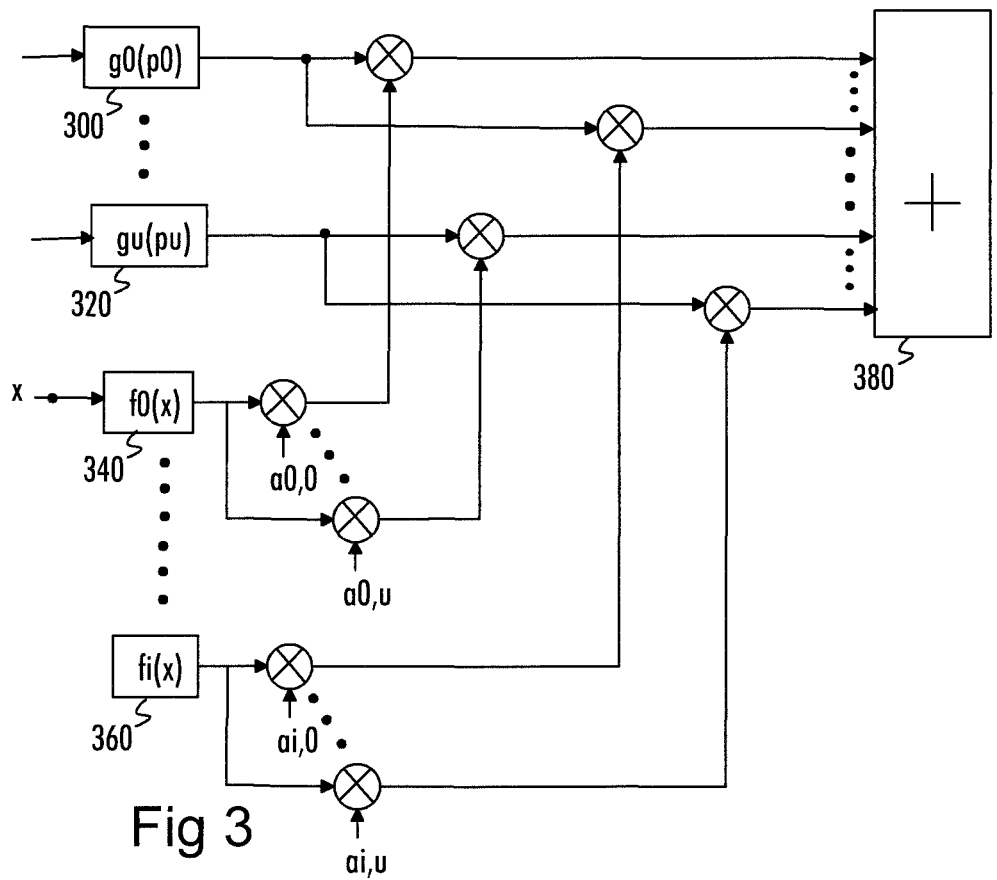
FIG. 3 illustrates the distortion and compensation according to an embodiment of the invention.

FIG. 3 illustrates an equivalent block diagram for Equation (6), wherein the coefficients $a_{0,0}$ to $a_{i,\mu}$ are computed to compensate for the distortion caused by the working conditions affecting the power amplifier, that is the distortion caused by functions $g_\mu$. FIG. 3 illustrates a block diagram of the contribution of different working conditions represented by blocks 300 and 320, each for one working condition, on the signal distortion of the power amplifier. The contribution of each working condition 300, 320 may be represented by a transfer function. When a given working condition 300, 320 is time-variant, the corresponding transfer function is time-variant as well. Elements 340, 360 represent base functions that are used to represent any non-linear memory function of the input signal x. As mentioned above, the base functions 340, 360 may be polynomial functions, series functions, delay elements, look-up tables etc. Coefficients $a_{0,0}$ to $a_{i,\mu}$ represent the predistortion coefficients that are computed according to embodiments of the invention to compensate for the distortion caused by blocks 300, 320. Each base function 340, 360 is multiplied by a respective coefficients $a_{0,0}$ to $a_{i,\mu}$, wherein a base function f0 shown by block 340 is multiplied by coefficients $a_{0,0}$ to $a_{0,\mu}$, a base function fi shown by block 360 is multiplied by coefficients $a_{i,0}$ to $a_{i,\mu}$, and so on. Each thus predistorted base function is then multiplied with a respective output of each predistortion function 300, 320, as shown in FIG. 3. The resulting signals are then summed in an adder 380, and in an optimum case, the result minus y is zero in case of optimal estimation of the predistortion parameter.

With this extension to take into account the plurality of working conditions, the cost functions (4) and (5) are expanded as:

$$\mu f(x, a, p) - y \mu \quad (7)$$

and $$\mu f(x, a, p) - y\|_2 \quad (8)$$

Let us consider an example where three working conditions (temperature, a supply voltage of the power amplifier, and a gate voltage of the power amplifier) distort the transmission signal to yield the following distortion functions $g_0$ to $g_2$:

$$g_0(p_0) = g_0(t) = 1$$

$$g_1(p_1) = g_1(V_{supply}) = V$$

$$g_2(p_2) = g_2(V_{gate}) = V^2 \quad (9)$$

The effect of the temperature on the signal distortion is in this case negligible (constant), while the supply and the gate voltage distort the signal in this case linearly (the supply voltage) and quadratically (the gate voltage). It should be noted that the number of working conditions may be arbitrary depending on which working conditions are selected to be taken into account in the NLM model, and the distortion functions $g_\mu$ may be more complex than that used as the example in Equation (9), e.g. polynomial functions. In this example, both distortion functions $g_1$ an $g_2$ depend on the same variable V, but differently. It should, however, be appreciated that this is just an illustrative example selected for the sake of clarity of the description, and they may depend on different variables. On the basis of Equation (9), Equation (6) may be written in the following form:

$$NLM = f(x, a, p) = \Sigma_{i=0}^n a_{i,0} f_i(x) + V \cdot \Sigma_{i=0}^n a_{i,1} f_i(x) + V^2 \cdot \Sigma_{i=0}^n a_{i,2} f_i(x) \quad (10)$$

Equation (10) may be written into a matrix form of $X \cdot e$ where $$e = \begin{cases} e_0 \ldots e_n = a_{0,0} \ldots a_{n,0} \\ e_{n+1} \ldots e_{2n+1} = a_{0,1} \ldots a_{n,1} \\ e_{2n+2} \ldots e_{3n+2} = a_{0,2} \ldots a_{n,2} \end{cases} \quad (11)$$

and $$X = \begin{cases} X_0 \ldots X_n = \sum_{i=0}^n f_i(x) \\ X_{n+1} \ldots X_{2n+1} = V \sum_{i=0}^n f_i(x) \\ X_{2n+2} \ldots X_{3n+2} = V^2 \sum_{i=0}^n f_i(x) \end{cases} \quad (12)$$

As a consequence, the minimization procedure realizes to minimizing function $\|X \cdot e - y\|_2$ which may be processed as $$\mu X \cdot e - y \mu_2 = (e^* X^* - y^*)(Xe - y) = e^* X^* \cdot Xe - e^* X^* \cdot y - y^* \cdot Xe + y^* y \quad (13)$$

where * denotes complex conjugate transpose operation. By making operation $$\frac{\partial}{\partial e^*}$$

we get $$X^* X \cdot e - X^* y \quad (14)$$

which should be minimized and is minimized when it approaches to zero as:

$$X^* X \cdot e - X^* y \to 0 \quad (15)$$

Thus, we obtain the coefficients as $$e = (X^* X)^{-1} \cdot X^* y \quad (16)$$

In practice, operation $X^* X$ may be computed as an autocorrelation operation which represents the autocorrelation of the effect of the working conditions. The operation $X^* y$ may be computed as a cross-correlation operation which represents the cross-correlation between the effect of the working conditions and the output of the power amplifier.

According to an embodiment, Equation (6) may be written in the following form by a simple rearrangement of terms:

$$f(x,a,p) = \Sigma_{\mu=0}^m g_\mu(p_\mu) \cdot f(x, a_\mu) = \Sigma_{i=0}^n f_i(x) \cdot \Sigma_{\mu=0}^m a_{i,\mu} g_\mu(p_\mu) \quad (17)$$

In the model of Equation (17), parameter $\Sigma_{\mu=0}^m a_{i,\mu} g_\mu(p_\mu)$ contains all the relevant information for the working condition range. For a constant set of working conditions within the working condition range (e.g. T=10° C., V=30V), the model coefficient can be calculated by:

$$a_i|_p = \Sigma_{\mu=0}^m a_{i,\mu} g_\mu(p_\mu) \quad (18)$$

If the amplifier characteristic can be considered as static for a certain time, the number of computations may be reduced by the factor m only by calculating first the model coefficient for the static working condition. Also the period of updating the coefficients may be increased in the case of static working conditions. Accordingly, the computational complexity may be reduced.

In general, embodiments of the invention compute a model representing mathematically an effect of a plurality of factors (the above-mentioned working conditions) on signal distortion caused by the power amplifier. The contribution of each factor (see Equation (9)) may be derived beforehand through measurements, for example, and then approximated as the mathematical representation of Equation (9) that provides an approximation of the effect of the factor. When such approximations are derived for a plurality of factors, a global model which incorporates a combined effect of the plurality of factors on the signal distortion caused by the power amplifier may be computed. As a consequence, embodiments of the present invention provide a global optimized model providing predistortion coefficients that compensate for the combined effect of the plurality of working conditions in a single mathematical model. In fact, the global model may be configured to take into account all working conditions that affect the signal distortion properties of the power amplifier, and the coefficients for such a global model may be derived by minimizing Equation (15) which yields Equation (16). Some conventional solutions store a table of coefficients for each working condition separately, and the predistortion coefficients are read from such a look-up table. Such tables provide a local discrete model for each coefficient, and taking into account the combined effect of the plurality of working conditions increases the size of the look-up tables exponentially in proportion to the number of the working conditions. Additionally, the working conditions have to be quantized to a certain degree which reduces accuracy. With the global mathematical model according to embodiments of the invention, values representing the current working conditions may simply be added to the global model, and the predistortion coefficients may be computed by minimizing Equation (15). Since no extensive look-up tables are needed, the present invention reduces the memory requirements. Additionally, an accurate global model is provided that represents the combined effect of the different working conditions, and the predistortion coefficients may be computed under arbitrary working conditions. Furthermore, as there is no need for quantizing the effect of the working conditions, the accuracy of the model is improved with respect to conventional look-up tables.

In another embodiment, the number of computed predistortion coefficients may be reduced to match with the accuracy of the model representing the distortion properties caused by the working conditions. For example, Equation (10) may be reduced into:

$$f(x,a,p) = \Sigma_{i=0}^n a_{i,0} f_i(x) + V \cdot \Sigma_{i=index1} a_{i,1} f_i(x) + V^2 \cdot \Sigma_{i=index2} a_{i,2} f_i(x) \quad (19)$$

where indices index1 and index2 are subsets of 0, 1, ..., n, i.e. they comprise less than n elements. As a consequence, the size of matrix X is reduced, which also reduces the computational complexity. Having n elements in each summation may provide too accurate compensation which does not improve the performance while causing unnecessary computations or even instability. Therefore, the number of coefficients computed may be defined as proportional to the complexity of the mathematical representation of the effect of said plurality of working conditions. The number of computed coefficients may be designed to roughly match with the order of the mathematical representation of the effect of the working conditions. For example, if the effect of a given working condition is of second order, e.g. $V^2$, the number of computed coefficients may be 2, 3, or 4. In general, the number of computed coefficients may be reduced from a maximum number of computed coefficients as low as the order of representation of the working condition (or slightly more than that, e.g. one or two coefficients more than said order). This may be achieved by reducing the number of base functions included in the computation, as defined by index1 and index2. The values of indices index1 and index2 may be determined separately, and they may have different values, thus providing flexibility to the computation.

Figure 6:
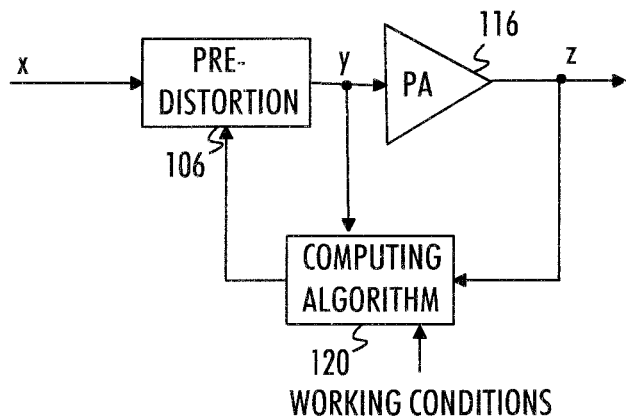
FIG. 6 illustrates a block diagram of another circuitry for predistorting a transmission signal in a radio transmitter according to an embodiment of the invention.

Let us consider another example by referring to FIG. 6, wherein the predistortion algorithm 120 acquires inputs from the output of the predistortion circuitry 106 (signal y) and the output of the power amplifier 116 (signal z). Additionally, the algorithm 120 receives the working conditions as the input. Let us model the output of the power amplifier in a matrix form under a varying drain voltage $V_{dd}$ as follows:

$$\hat{Z} = Y \cdot e_0 + Y_1 \cdot e_1 + Y_2 \cdot e_2 \qquad (20)$$

where $$Y_1 = \Delta V_{dd} \cdot Y$$

$$Y_2 = \Delta V_{dd}^2 \cdot Y$$

$$\Delta V_{dd} = V_{dd} - V_{ddref} \qquad (21)$$

where $e_0$, $e_1$, and $e_2$ model coefficients g the distortion of the power amplifier, and $V_{ddref}$ defines a reference level for the drain voltage. In other words, Equations (20) and (21) show a second order approach of how the distortion of the power amplifier 116 is affected by the varying drain voltage $V_{dd}$, and the model may be written into the following form:

$$\hat{Z} = Y \cdot e_0 + \Delta V_{dd} \cdot Y \cdot e_1 + \Delta V_{dd}^2 \cdot Y \cdot e_2 \qquad (22)$$

From Equation (22), a combined autocorrelation matrix $R_{yyz}$ and a combined cross-correlation vector $r_{yzz}$ similar to that of Equation (16) may be derived as follows:

$$R_{yyz} = \begin{bmatrix} Y^* \\ \Delta V_{dd} \cdot Y^* \\ \Delta V_{dd}^2 \cdot Y^* \end{bmatrix} \begin{bmatrix} Y & \Delta V_{dd} \cdot Y & \Delta V_{dd}^2 \cdot Y \end{bmatrix} \qquad (23)$$

$$= \begin{bmatrix} R_{yy} & \Delta V_{dd} \cdot R_{yy} & \Delta V_{dd}^2 \cdot R_{yy} \\ \Delta V_{dd} \cdot R_{yy} & \Delta V_{dd}^2 \cdot R_{yy} & \Delta V_{dd}^3 \cdot R_{yy} \\ \Delta V_{dd}^2 \cdot R_{yy} & \Delta V_{dd}^3 \cdot R_{yy} & \Delta V_{dd}^4 \cdot R_{yy} \end{bmatrix}$$

where $R_{yy}$ represents autocorrelation matrix of Y, and the combined autocorrelation matrix $R_{yyz}$ comprises as sub-matrices autocorrelation matrix $R_{yy}$ as a function of the varying drain voltage $\Delta V_{dd}$.

$$r_{yzz} = \begin{bmatrix} Y^* \\ \Delta V_{dd} \cdot Y^* \\ \Delta V_{dd}^2 \cdot Y^* \end{bmatrix} \cdot Z = \begin{bmatrix} r_{yz} \\ \Delta V_{dd} \cdot r_{yz} \\ \Delta V_{dd}^2 \cdot r_{yz} \end{bmatrix} \qquad (24)$$

where $r_{yz}$ represent cross-correlation of Y and Z in a vector form, and the combined cross-correlation vector $r_{yzz}$ comprises as sub-vectors the cross-correlation vector $r_{yz}$ as a function of the varying drain voltage $\Delta V_{dd}$. Now, according to Equation (16) we get the similar form for this example as:

$$e(e_0, e_1, e_2) = R_{yyz}^{-1} \cdot r_{yzz} \qquad (25)$$

where e represents the coefficients to be applied to the predistortion circuitry 106. In order to reduce the complexity of the matrix inversion, the size of the combined autocorrelation matrix $R_{yyz}$ may be reduced, as described above. The size of the combined cross-correlation vector may be reduced accordingly. This may be achieved by eliminating least-significant samples or sub-matrix elements of the combined autocorrelation matrix and the combined cross-correlation vector, as illustrated in FIGS. 7A and 7B. FIG. 7A illustrates as diagonal lining elements removed from the combined autocorrelation matrix, and FIG. 7B illustrates as diagonal lining those elements removed from the combined cross-correlation vector. Mathematically, this may be achieved according to Equation (19) by limiting the number of rows and columns of at least some of sub-matrices of the combined autocorrelation matrix $R_{yyz}$ and the number of elements of at least some of the sub-vectors of the combined cross-correlation vector from n to ind1/ind2. This results in a reduced combined autocorrelation matrix and a reduced combined cross-correlation vector as follows:

$$R_{yyz} = \begin{bmatrix} R_{yy}(n,n) & \Delta V_{dd} \cdot R_{yy}(n, ind1) & \Delta V_{dd}^2 \cdot R_{yy}(n, ind2) \\ \Delta V_{dd} \cdot R_{yy}(ind1, n) & \Delta V_{dd}^2 \cdot R_{yy}(ind1, ind1) & \Delta V_{dd}^3 \cdot R_{yy}(ind1, ind2) \\ \Delta V_{dd}^2 \cdot R_{yy}(ind2, n) & \Delta V_{dd}^3 \cdot R_{yy}(ind2, ind1) & \Delta V_{dd}^4 \cdot R_{yy}(ind2, ind2) \end{bmatrix} \qquad (26)$$

$$r_{yzz} = \begin{bmatrix} r_{yz}(n) \\ \Delta V_{dd} \cdot r_{yz}(ind1) \\ \Delta V_{dd}^2 \cdot r_{yz}(ind2) \end{bmatrix}$$

FIGS. 8A and 8B illustrate another embodiment where the elements are not removed at the end of each sub-matrix of the combined autocorrelation matrix and sub-vector of the combined cross-correlation vector, as was done in the embodiment of FIGS. 7A and 7B. Instead, the elements are removed selectively from inside of the sub-matrices and sub-vectors. This may be achieved by defining a step size w (integer greater than 1) that is introduced in the sum operations of Equation (19). In an embodiment, index i in Equation (19) runs from zero to n in step sizes defined by w. In another embodiment, index i in Equation (19) runs from one to n in step sizes defined by w. In yet another embodiment, index i in Equation (19) runs from w to n in step sizes defined by w.

In the embodiments of FIGS. 7A to 8B, the sub-element consisting of the basic autocorrelation sub-matrix $R_{yy}(n,n)$ and the basic cross-correlation vector $r_{yy}(n)$ may be left intact, and they may be bypassed in the reduction of elements. In other words, those sub-elements that are not scaled by the working conditions may be bypassed in the reduction of elements.

In an embodiment, the combined autocorrelation matrices and the combined cross-correlation vectors may be summed over all values of each working condition to provide an autocorrelation matrix and a cross-correlation vector which averages the effect of varying values of each working condition, e.g. over all values of the drain voltage $V_{dd}$, thus resulting in:

$$R_{yyzsum} = \Sigma_{V_{dd}} R_{yyz}(V_{dd}) \text{ and}$$

$$r_{yzzsum} = \Sigma_{V_{dd}} r_{yzz}(V_{dd}) \quad (27)$$

This provides an averaged weighting coefficients that are averaged over all the working conditions accounted for in the global model. Accordingly, there is no need for recomputation of the weighting coefficients. In another embodiment, the summation over all the values of each working condition may be omitted, and the coefficients may be recomputed during the operation, e.g. upon a detected change in at least one of the working conditions included in the model.

The number of weighting coefficients computed by the algorithm 120 may be dependent on the working conditions, e.g. the amplitude of the power supply voltage of the power amplifier and the amplitude of the input signal x of the predistortion circuitry 106. In order to reduce the complexity of the computing algorithm 120, the input signal x may be pre-scaled in a pre-scaling circuitry 900, wherein a scaling factor of the pre-scaling circuitry may be computed as:

$$\alpha_{pre} = \frac{32 \text{ V}}{V_{supply}} \quad (28)$$

where V represents a voltage (amplitude) of the input signal x, and $V_{supply}$ is the supply voltage of the power amplifier 116. The constant (32 in this example) may be replaced by another constant for different working conditions. Other similar equations for the pre-scaling function may be derived for other working conditions so as to provide the computing algorithm 120 and the predistortion circuitry 106 with a constant complexity and constant number of weighting coefficients, under variable working conditions. The pre-scaled signal x is then applied to the predistortion circuitry. After the predistortion, the effect of the pre-scaling is removed in a post-scaling circuitry 902 configured to weight the output of the predistortion circuitry 106 by $1/\alpha_{pre}$. Signal y used as the input by the computing algorithm 120 may be acquired at the output of the post-scaling circuitry 902.

Figure 4:
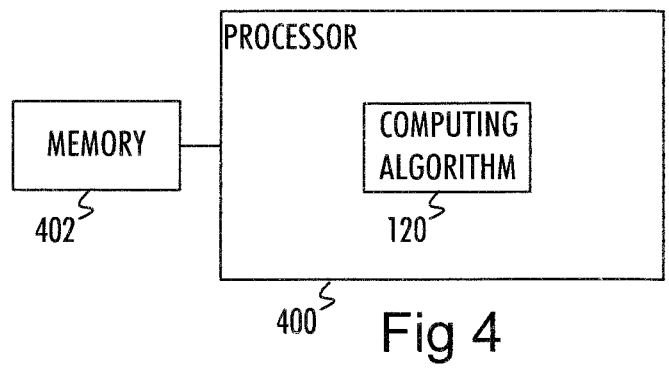
FIG. 4 illustrates a block diagram of an apparatus configured to carry out a predistortion algorithm according to an embodiment of the invention.

An embodiment provides an apparatus comprising at least one processor and at least one memory including a computer program code, wherein the at least one memory and the computer program code are configured, with the at least one processor, to cause the apparatus to compute the global model and the predistortion coefficients. FIG. 4 illustrates such an apparatus, wherein a processor or a processing circuitry 400 executes the computation algorithm 120 for computing the predistortion coefficients. The algorithm may be carried out as a computer program defined by computer instructions stored in a memory unit 402. The memory 402 may also store the mathematical models representing the effect of each working conditions and/or the global model storing the combined effect of the different working conditions that are taken into account in the computing algorithm 120.

As used in this application, term 'processor' and 'processing circuitry' refers to all of the following: (a) hardware-only circuit implementations, such as implementations in only analog and/or digital circuitry, and (b) to combinations of circuits and software (and/or firmware), such as (as applicable): (i) a combination of processor(s) or (ii) portions of processor(s)software including digital signal processor(s), software, and memory(ies) that work together to cause an apparatus to perform various functions, and (c) to circuits, such as a microprocessor(s) or a portion of a microprocessor (s), that require software or firmware for operation, even if the software or firmware is not physically present. This definition of 'processorä or the 'processing circuitry' applies to all uses of this term in this application. As a further example, as used in this application, the terms would also cover an implementation of merely a processor (or multiple processors) or portion of a processor and its (or their) accompanying software and/or firmware. The term "circuitry" would also cover, for example and if applicable to the particular element, a baseband integrated circuit or applications processor integrated circuit for the radio transmitter that may be a mobile phone or another radio device, e.g. a base station.

Figure 5:
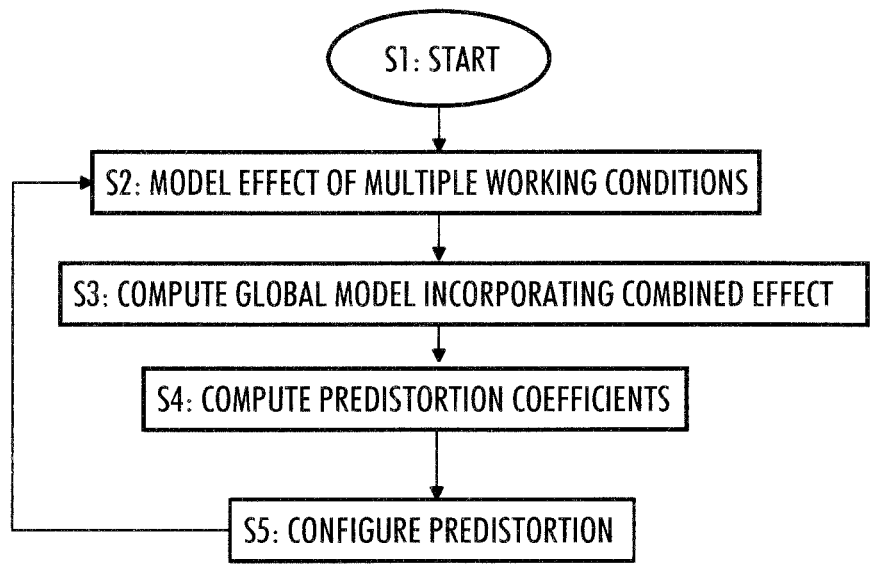
FIG. 5 illustrates a flow diagram of a process for computing predistortion coefficients according to an embodiment of the invention.

FIG. 5 illustrates an embodiment of the computing algorithm 120 that may be executed by the processor 400 as a computer process. The process starts in block S1. A triggering event may be activation of the radio transmitter. In S2, an effect of a plurality of factors on signal distortion caused by the power amplifier are modeled mathematically, e.g. see Equation (9). In S3, a global model which incorporates a combined effect of the plurality of factors on signal distortion caused by the power amplifier is computed, e.g. see Equations (6) and (10). In block S4, coefficients compensating for the combined effect of the plurality of factors on the signal distortion caused by the power amplifier are computed. This may be carried out during the operation of the radio transmitter, e.g. in connection with preparations to start transmission of radio signals. In S5, pre-distortion of a transmission signal is configured with the computed coefficients before applying the pre-distorted transmission signal to the power amplifier, thus compensating for the signal distortion caused by the power amplifier.

In an embodiment, the coefficients are computed as a result of minimizing a norm of a difference between an input signal representing an input of the power amplifier weighted by said coefficients and an output signal representing an output of the power amplifier, e.g. see Equation (13). In an embodiment, the minimization results in computing the coefficients by solving the Equation (16), where e represents a set of said coefficients, X represents the input signal in a matrix form and weighted by the effect of the plurality of factors, and y represents the output signal. In an embodiment, $X^* \cdot X$ of Equation (16) is computed as an autocorrelation of the effect of the plurality of factors, and $X^*y$ of Equation (16) is computed as a cross-correlation between the effect of the plurality of factors and the output signal.

In an embodiment, said plurality of factors (or working conditions) comprise at least one of the following: temperature, a supply voltage of the power amplifier, a gate voltage of at least one transistor of the power amplifier, a drain voltage of at least one transistor of the power amplifier, a source voltage of at least one transistor of the power amplifier, and a bandwidth of the signal. When the power amplifier or the non-linear amplifier comprises multiple transistors, the parameters of each transistor may be considered as separate working conditions.

In an embodiment, the combined effect of said plurality of factors is represented as a polynomial function. In an embodiment, an order of the polynomial function is of second order or less. In an embodiment, the combined effect of said plurality of factors is normalized, e.g. power-normalized.

In an embodiment, the number of coefficients computed is proportional to the complexity of the mathematical representation of the effect of said plurality of factors.

The processes or methods described herein may also be carried out in the form of a computer process defined by a computer program. The computer program may be in source code form, object code form, or in some intermediate form, and it may be stored in some sort of carrier, which may be any entity or device capable of carrying the program. Such carriers include a record medium, computer memory, read-only memory, electrical carrier signal, telecommunications signal, and software distribution package, for example. Depending on the processing power needed, the computer program may be executed in a single electronic digital processing unit or it may be distributed amongst a number of processing units.

The present invention is applicable to a radio transmitter which may be en element of a radio communication system, e.g. a cellular communication system. The cellular communication system may be Universal Mobile Telecommunication System or any one of its Evolution versions (Long-Term Evolution (Advanced), a system based on International Mobile Telecommunications (IMT) standard, Global System for Mobile communications (GPS) or any one of its extensions (e.g. General Packet Radio Service), Wireless Interoperability for Microwave Access (WiMAX), or a system based on IEEE standards, e.g. 802.11, 802.15, and 802.16. These are merely examples of systems incorporating radio transmitters, and the radio transmitters and apparatuses comprised in the radio transmitter according to embodiments of the invention may be applied to other radio systems as well. The protocols and specifications of radio systems and their entities develop rapidly. Such development may require extra changes to the described embodiments. Therefore, all words and expressions should be interpreted broadly and they are intended to illustrate, not to restrict, the embodiment. It will be obvious to a person skilled in the art that, as technology advances, the inventive concept can be implemented in various ways. The invention and its embodiments are not limited to the examples described above but may vary within the scope of the claims.

The invention claimed is:

1. A method, comprising:
for each of a plurality of factors affecting signal distortion caused by a non-linear amplifier, creating a mathematical model for the effect of the factor, wherein the mathematical model includes a mathematical function representing an approximation of the effect of the factor;
computing a global model based on a combination of the mathematical models for each effect of the plurality of factors, wherein the global model represents mathematically a combined effect of the plurality of factors on signal distortion caused by the non-linear amplifier,
computing, during operation of the non-linear amplifier, one or more coefficients derived from the global model, wherein the coefficients are computed as a result of minimizing of a difference between an input signal representing an input of the non-linear amplifier and an output signal representing an output of the non-linear amplifier, wherein the one or more coefficients compensate for the combined effect of the plurality of factors on the signal distortion caused by the non-linear amplifier, and wherein the one or more coefficients are computed during operation of the non-linear amplifier using parameters developed during, and based on, data generated during functioning of the non-linear amplifier; and
pre-distorting a signal with coefficients derived from the global model before applying the thus pre-distorted signal to the non-linear amplifier so as to compensate for the signal distortion caused by the non-linear amplifier.

2. The method of claim 1, wherein the minimization results in computing the coefficients by solving an equation $$e = (X^* \cdot X)^{-1} \cdot X^* \cdot y,$$

where e represents a set of said coefficients, X represents the input signal in a matrix form and weighted by the effect of the plurality of factors, and y represents the output signal.

3. The method of claim 2, wherein $X^* \cdot X$ is computed as an autocorrelation of the effect of the plurality of factors, and wherein the $X^* y$ is computed as a cross-correlation between the effect of the plurality of factors and the output signal.

4. The method of claim 1, wherein the minimization results in computing the coefficients by solving an equation $$e = (Y^* \cdot Y)^{-1} \cdot Y^* \cdot x,$$

where e represents a set of said coefficients, Y represents the output signal in a matrix form and weighted by the effect of the plurality of factors, and x represents the input signal.

5. The method of claim 4, wherein $Y^* \cdot Y$ is computed as an autocorrelation of the effect of the plurality of factors, and wherein the $Y^* x$ is computed as a cross-correlation between the effect of the plurality of factors and the input signal.

6. The method of claim 1, wherein said plurality of factors comprise at least one of the following: temperature, a supply voltage of the non-linear amplifier, a gate voltage of at least one transistor of the nonlinear amplifier, a drain voltage of at least one transistor of the non-linear amplifier, a collector voltage of at least one transistor of the non-linear amplifier, and a bandwidth of the signal to be predistorted.

7. The method of claim 1, wherein an order of the polynomial function is second order or less.

8. The method of claim 1, wherein the combined effect of said plurality of factors is normalized.

9. The method of claim 1, wherein the number of coefficients computed is proportional to the complexity of the mathematical representation of the effect of said plurality of factors.

10. The method of claim 1, further comprising:
forming an autocorrelation matrix describing autocorrelation properties of the predistorted signal input to the non-linear amplifier under an effect of said at least one factor;
forming a cross-correlation vector describing cross-correlation properties between the predistorted signal input to the non-linear amplifier and an output signal of the non-linear amplifier under an effect of said at least one factor; and
reducing the size of the auto-correlation matrix and the cross-correlation vector by removing at least some of their elements according to determined criterion.

11. An apparatus, comprising means configuring the apparatus to carry out the method according to claim 1.

12. A computer program product embodied on a distribution medium readable by a computer and comprising program instructions which, when loaded into an apparatus, execute the method according to claim 1.

13. An apparatus comprising:
at least one processor; and
at least one memory including a computer program code, wherein the at least one memory and the computer program code are configured, with the at least one processor, to cause the apparatus to:
a plurality of factors affecting signal distortion caused by a non-linear amplifier, creating a mathematical model for the effect of the factor, wherein the mathematical model includes a mathematical function representing an approximation of the effect of the factor;
compute a global model based on a combination of the mathematical models for each effect of the plurality of factors, wherein the global model represents mathematically a combined effect of the plurality of factors on signal distortion caused by the non-linear amplifier;
compute, during operation of the non-linear amplifier, one or more coefficients derived from the global model, wherein the one or more coefficients compensate for the combined effect of the plurality of factors on the signal distortion caused by the non-linear amplifier, wherein the coefficients are computed as a result of minimizing of a difference between an input signal representing an input of the non-linear amplifier and an output signal representing an output of the non-linear amplifier, and wherein the one or more coefficients are computed during operation of the non-linear amplifier using parameters developed during, and based on, data generated during functioning of the non-linear amplifier; and
pre-distort a signal with coefficients derived from the global model before applying the so pre-distorted signal to the non-linear amplifier, thus compensating for the signal distortion caused by the non-linear amplifier.

14. The apparatus of claim 13, wherein the at least one memory and the computer program code are configured, with the at least one processor, to cause the apparatus to carry out the minimization by computing the coefficients by solving an equation $$e=(X^*\cdot X)^{-1}\cdot X^*y,$$

where e represents a set of said coefficients, X represents the input signal in a matrix form and weighted by the effect of the plurality of factors, and y represents the output signal.

15. The apparatus of claim 13, wherein the at least one memory and the computer program code are configured, with the at least one processor, to cause the apparatus to compute $X^*\cdot X$ as an autocorrelation of the effect of the plurality of factors, and wherein the $X^*y$ is computed as a cross-correlation between the effect of the plurality of factors and the output signal.

16. The apparatus of claim 13, wherein the at least one memory and the computer program code are configured, with the at least one processor, to cause the apparatus to compute the minimization by solving an equation $$e=(Y^*\cdot Y)^{-1}\cdot Y^*x,$$

where e represents a set of said coefficients, Y represents the output signal in a matrix form and weighted by the effect of the plurality of factors, and x represents the input signal.

17. The apparatus of claim 16, wherein the at least one memory and the computer program code are configured, with the at least one processor, to cause the apparatus to compute $Y^*\cdot Y$ as an autocorrelation of the effect of the plurality of factors, and wherein the $Y^*x$ is computed as a cross-correlation between the effect of the plurality of factors and the input signal.

18. The apparatus of claim 13, wherein said plurality of factors comprise at least one of the following: temperature, a supply voltage of the non-linear amplifier, a gate voltage of at least one transistor of the non-linear amplifier, a drain voltage of at least one transistor of the non-linear amplifier, a collector voltage of at least one transistor of the non-linear amplifier, and a bandwidth of the signal.

19. The apparatus of claim 13, wherein the at least one memory and the computer program code are configured, with the at least one processor, to cause the apparatus to represent the combined effect of said plurality of factors as a polynomial function.

20. The apparatus of claim 19, wherein an order of the polynomial function is second order or less.

21. The apparatus of claim 13, wherein the at least one memory and the computer program code are configured, with the at least one processor, to cause the apparatus to normalize the combined effect of said plurality of factors normalized.

22. The apparatus of claim 13, wherein the number of coefficients computed is proportional to the complexity of the mathematical representation of the effect of said plurality of factors.

23. The apparatus of claim 13, wherein the at least one memory and the computer program code are configured, with the at least one processor, to cause the apparatus to:
form an autocorrelation matrix describing autocorrelation properties of the predistorted signal input to the non-linear amplifier under an effect of said at least one factor;
form a cross-correlation vector describing cross-correlation properties between the predistorted signal input to the non-linear amplifier and an output signal of the non-linear amplifier under an effect of said at least one factor; and
reduce the size of the auto-correlation matrix and the cross-correlation vector by removing at least some of their elements according to determined criterion.

24. The apparatus of claim 13, further comprising a radio transmitter configured to provide the apparatus with radio transmission capability, wherein the non-linear amplifier is a power amplifier of the radio transmitter.

* * * * *